United States Patent [19]
Tokumo

[11] 4,456,887
[45] Jun. 26, 1984

[54] DIFFERENTIAL AMPLIFIER

[75] Inventor: Akio Tokumo, Saitama, Japan

[73] Assignee: Pioneer Electronic Corporation, Tokyo, Japan

[21] Appl. No.: 304,734

[22] Filed: Sep. 23, 1981

[30] Foreign Application Priority Data

Sep. 25, 1980 [JP] Japan ............................. 55-136595[U]
Sep. 26, 1980 [JP] Japan ............................. 55-137427[U]

[51] Int. Cl.³ ............................................. H03F 3/45
[52] U.S. Cl. .................................. 330/261; 330/257; 330/252
[58] Field of Search ................. 330/252, 257, 260, 261

[56] References Cited

FOREIGN PATENT DOCUMENTS

| 54-47467 | 4/1979 | Japan | 330/252 |
| 55-39432 | 3/1980 | Japan | 330/261 |
| 55-100711 | 7/1980 | Japan | 330/261 |
| 459841 | 3/1975 | U.S.S.R. | 330/252 |

Primary Examiner—James B. Mullins
Assistant Examiner—G. Wan
Attorney, Agent, or Firm—Sughrue, Mion, Zinn, Macpeak and Seas

[57] ABSTRACT

Current mirror circuits are added to a differential amplifier and the amplifier differential outputs are taken from one or both of the current paths in the current mirror circuit so that the relationship between input and output signals will be independent of the base-emitter voltages of the differential transistors.

11 Claims, 7 Drawing Figures

DIFFERENTIAL AMPLIFIER

BACKGROUND OF THE INVENTION

This invention relates to differential amplifiers, and more particularly to a distortionless differential amplifier employing bipolar transistors.

When an amplifier is formed by a bipolar transistor, the following relationship (1) exists between the collector current $I_C$ and the base-emitter voltage $V_{BE}$:

$$I_C = I_S \left\{ \exp\left(\frac{qV_{BE}}{KT}\right) - 1 \right\} \quad (1)$$

where $I_S$ is the reverse saturation current, q is the electron charge, K is the Boltzman constant, and T is the junction absolute temperature. Thus, the input-output characteristic of the bipolar transistor is non-linear, and the collector output current waveform is significantly distorted with respect to the input voltage waveform.

In order to eliminate this distortion, a technique has been employed called "current negative feedback" in which an emitter resistor is inserted in the circuit. However, this method of distortion reduction is not desirable in that the distortion cannot be completely eliminated, the circuit gain is decreased, and the circuit becomes unstable if the amount of feedback is increased.

FIG. 1 is a circuit diagram showing one example of a differential amplifier which is generally employed. The emitters of a pair of differential PNP transistors $Q_3$ and $Q_4$ are connected together through current feedback emitter resistors $R_3$ and $R_4$, and bias currents are applied to the transistors by a current source $I_O$. A reference potential, e.g. ground, is applied to the base of the transistor $Q_4$, while an input signal $e_i$ is applied to the base of the transistor $Q_3$. Differential inversion outputs are provided across the collector resistors $R_1$ and $R_2$ of the two transistors.

Let us consider the relationship of AC components only which are obtained by ignoring the DC bias voltages and currents in the differential amplifier. If the AC components of the base-emitter voltages of the transistors $Q_3$ and $Q_4$ are represented by $v_{be3}$ and $v_{be4}$, respectively, then the relationship between the input voltage $e_i$ and the emitter currents $i_{e3}$ and $i_{e4}$ is:

$$e_i = v_{be3} + R_3 i_{e3} + R_4 i_{e4} - v_{be4} \quad (2)$$

The relationship between the voltage $v_{ee}$ between the two emitters and the positive phase output $v_{O2}$ is:

$$v_{O2} = \frac{R_2}{R_3 + R_4} v_{ee} \quad (3)$$

If the input signal $e_i$ changes in the positive direction (or in the increasing direction), the emitter current (substantially equal to the collector current) of the transistor $Q_3$ is decreased, while the emitter current (substantially equal to the collector current) of the transistor $Q_4$ is increased. Therefore, as is apparent from the characteristic curve of the expression (1) (not illustrated since it is well known in the art), the relationship between the variation width $\Delta V_{BE3}$ and $\Delta V_{BE4}$ of the base-emitter voltages of the transistors is:

$$|\Delta V_{BE3}| > |\Delta V_{BE4}| \quad (4)$$

Accordingly, in the expression (2), $$v_{be3} - v_{be4} > 0 \quad (5)$$

Therefore, as the input voltage $e_i$ is increased, in the expression (2) the rate of increase of the voltage $v_{ee}$ between both emitters ($= R_3 i_{e1} + R_4 i_{e2}$) is decreased, and accordingly from the expression (3) the output voltage $v_O$ is also decreased. When the input voltage $e_i$ changes in the negative direction, the same phenomenon occurs. Therefore, the output waveform $v_O$ with respect to the sinusoidal input waveform $e_i$ is such that, as shown in FIG. 2, the positive and negative peaks are collapsed, thus producing distortion.

SUMMARY OF THE INVENTION

Accordingly, an object of this invention is to provide a simple arrangement for a differential amplifier in which the output distortion of bipolar transistors due to the nonlinearity of the input and output characteristics can be completely eliminated.

This is achieved by a first embodiment of a differential amplifier according to this invention which comprises: first and second transistors having a first electrical conductivity and having their bases employed as differential input terminals; third and fourth transistors having a second electrical conductivity opposite to the first electrical conductivity, the third and fourth transistors being connected differentially with the outputs of the first and second transistors as the base inputs of the third and fourth transistors; first current supply means for supplying currents in a predetermined ratio to the first and third transistors; and second current supply means for supplying currents in a predetermined ratio to the second and fourth transistors, so that the output is provided in correspondence to the variations of current flowing in the third and/or fourth transistor.

In a second embodiment of the invention, the differential amplifier comprises: first and second transistors having the same electrical conductivity and having their bases employed as differential input terminals; third and fourth transistors having the same electrical conductivity as that of the first and second transistors, the third and fourth transistors being connected differentially with the outputs of the first and second transistors as the base inputs of the third and fourth transistors; means for supplying currents in a predetermined ratio to the first and fourth transistors; and means for supplying currents in a predetermined ratio to the second and third transistors, so that the output is provided in correspondence to the variations of current flowing in the third and/or fourth transistor.

BRIEF DESCRIPTION OF THE DRAWINGS

The invention will be more clearly understood from the following description in conjunction with the accompanying drawings wherein like elements are designated by like reference numerals. In the drawings.

DETAILED DESCRIPTION OF THE PREFERRED EMBODIMENTS

Figure 1:
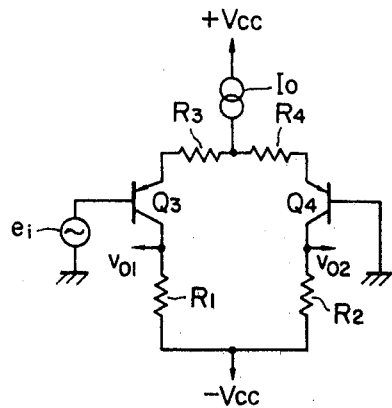
FIG. 1 is a circuit diagram of a conventional differential amplifier.
Figure 2:
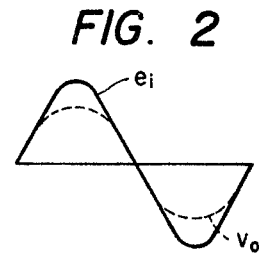
FIG. 2 is a diagram showing input and output waveforms in the circuit of FIG. 1.
Figure 3:
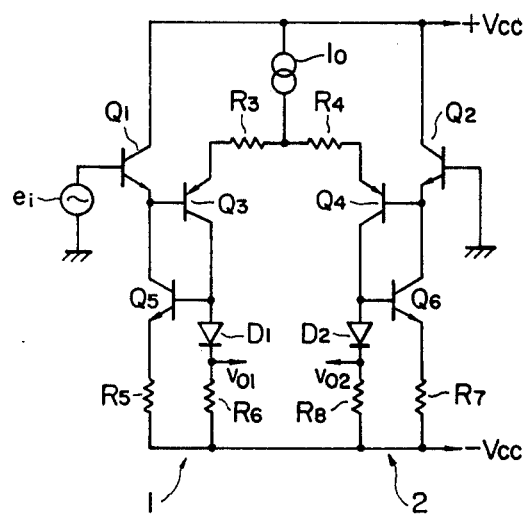
FIG. 3 is a circuit diagram of one example of a first embodiment of a differential amplifier according to this invention.

FIG. 3 is a circuit diagram showing one example of the differential amplifier according to this invention. In FIGS. 3 and 1, like parts are designated by like reference characters. PNP third and fourth transistors $Q_3$ and $Q_4$, respectively, are differentially connected and have their emitters connected together through emitter resistors $R_3$ and $R_4$. The bases of the transistors $Q_3$ and $Q_4$ are supplied with the emitter outputs of first and second NPN transistors $Q_1$ and $Q_2$, respectively, which are each connected in the form of emitter followers. The bases of the transistors $Q_1$ and $Q_2$ are differential input terminals. In this example, an input signal $e_i$ is applied to the base of the transistor $Q_1$, and ground potential is applied to the base of the transistor $Q_2$.

In order to supply currents in a constant ratio to the transistors $Q_1$ and $Q_3$, a current mirror circuit 1 comprising a transistor $Q_5$, a diode $D_1$ and resistors $R_5$ and $R_6$ is provided. Similarly, in order to supply currents in a constant ratio to the transistors $Q_2$ and $Q_4$, a current mirror circuit 2 comprising a transistor $Q_6$, and a diode $D_2$ and resistors $R_7$ and $R_8$ is provided. The diodes $D_1$ and $D_2$ may, of course, be replaced by diode-connected transistors.

If only the AC components in the relationship between the input voltage $e_i$ and the emitter currents $i_{e3}$ and $i_{e4}$ of the transistors $Q_3$ and $Q_4$ is considered, then this relationship can be represented as follows:

$$e_i = -v_{be1} + v_{be3} + i_{e3}R_3 + i_{e4}R_4 - v_{be4} + v_{be2} \quad (6)$$

Let us consider the case where the input voltage $e_i$ changes in the positive direction under the condition that the current ratios in the current mirror circuits 1 and 2 are set to unity by setting $R_5$ equal to $R_6$ and $R_7$ equal to $R_8$. In this case, the collector current of the transistor $Q_3$ decreases, while the collector current of the transistor $Q_4$ increases. Therefore, the variation ranges ($\Delta V_{BE}$) of the base-emitter voltages of these transistors vary as follows: The variation ranges of the base-emitter voltages of the transistors $Q_1$ and $Q_3$ decrease, with $\Delta V_{BE1} = \Delta V_{BE3}$, while the variation ranges of the base-emitter voltages of the transistors $Q_2$ and $Q_4$ increase, with $\Delta V_{BE2} = \Delta V_{BE4}$. Accordingly, in the expression (6), $v_{be1}$ and $v_{be3}$ cancel each other and the same is true with $v_{be2}$ and $v_{be4}$. Thus, the expression (6) can be rewritten into the following expression (7):

$$e_i = i_{e3}R_3 + i_{e4}R_4 = v_{ee} \quad (7)$$

Thus, the input voltage $e_i$ is proportional to the emitter-emitter voltage $v_{ee}$; that is, the input voltage $e_i$ has a ratio of 1:1 with the voltage $v_{ee}$ between the emitters of transistors $Q_3$ and $Q_4$. The positive phase output is:

$$v_{O2} = \frac{R_8}{R_3 + R_4} v_{ee} \quad (8)$$

Therefore, the input and the output are substantially linearly proportional in a relationship which includes no $v_{be}$ components. Thus, a distortionless output can be obtained.

Similarly, if the input changes in the negative direction, the AC components $v_{be}$ of the transistors are cancelled out by one another, and therefore a distortionless output can be obtained. It goes without saying that the negative phase output $v_{O1}$ is distortionless for the same reasons as given above with respect to the positive phase output.

In the above-described example, in each of the current mirror circuits 1 and 2, the current mirror ratio is set to one (1). Now, let us consider the case where the current mirror ratios of the current mirror circuits 1 and 2 are set to a constant value $\alpha$. Since the relationship between $V_{BE}$ and $I_C$ of a transistor can be represented by the expression (1), the difference between the base-emitter voltages ($V_{BE}$) of the transistors $Q_1$ and $Q_3$ can be expressed as follows:

$$V_{BE3} - V_{BE1} = \frac{KT}{q} \left( \ln\left(\frac{I_{C3}}{I_{S3}} + 1\right) - \ln\left(\frac{I_{C1}}{I_{S1}} + 1\right) \right) \quad (9)$$

For the purposes of this discussion, the junction temperature can be considered equal. It can also be assumed that $I_{C1}/I_{S1} \gg 1$ and $I_{C3}/I_{S3} \gg 1$. Assuming $I_{C3}/I_{C1} = \alpha$ (the current mirror ratio), the expression (9) can be rewritten into the following expression (10):

$$V_{BE3} - V_{BE1} \approx \frac{KT}{q} \ln \alpha \quad (10)$$

where $I_{S1} \approx I_{S3}$.

Similarly, for the difference between the base-emitter voltages of the transistors $Q_2$ and $Q_4$ a relationship similar to that indicated by the expression (10) is true. Thus, these differences show the same constant value. Accordingly, $(v_{be3} - v_{be1})$ and $(v_{be2} - v_{be4})$ in the expression (6) becomes constant. Thus, it can be seen that as long as the current mirror ratios are set to any constant value $\alpha$, the output is distortionless since it is independent of the AC components $v_{be}$ of the transistors.

Figure 4:
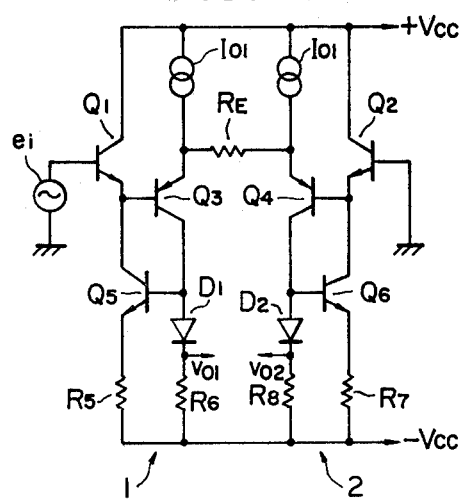
FIG. 4 is a circuit diagram of a second example of a first embodiment of a differential amplifier according to this invention.

FIG. 4 is a circuit diagram showing a second example of the first embodiment of the differential amplifier according to this invention. In FIGS. 4 and 3, like parts are designated by like reference characters. In this example, a common emitter resistor $R_E$ is employed, and two current sources $I_{O1}$ and $I_{O2}$ are used to feed the transistors $Q_3$ and $Q_4$, respectively. The other circuit elements are arranged similarly as in the case of FIG. 3, and therefore their detailed description will be omitted.

Figure 5:
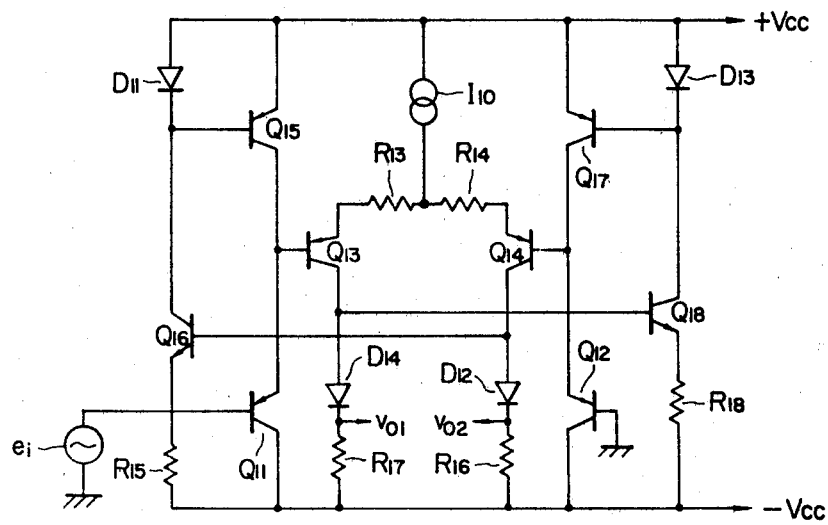
FIG. 5 is a circuit diagram of a first example of a second embodiment of a differential amplifier according to this invention.

FIG. 5 is a circuit diagram showing one example of a second embodiment of the differential amplifier according to this invention. PNP transistors $Q_{13}$ and $Q_{14}$ are connected differentially and have their emitters connected together through emitter resistors $R_{13}$ and $R_{14}$. The bases of the transistors $Q_{13}$ and $Q_{14}$ are supplied with the emitter outputs of PNP transistors $Q_{11}$ and $Q_{12}$ which are in the form of emitter followers. The bases of the transistors $Q_{11}$ and $Q_{12}$ are employed as differential input terminals. In this example, an input signal $e_i$ is applied to the base of the transistor $Q_{11}$, and ground potential is applied to the base of the transistor $Q_{12}$.

In order to supply currents in a predetermined ratio to the transistors $Q_{11}$ and $Q_{14}$, a current drainage type current mirror circuit is provided consisting of a transistor $Q_{15}$ and a diode $D_{11}$ and a current absorption type current mirror circuit is provided consisting of a transistor $Q_{16}$, a diode $D_{12}$ and resistors $R_{15}$ and $R_{16}$. The collector current of the transistor $Q_{14}$ is applied to the diode $D_{12}$ in the current absorption type current mirror circuit, and a current defined by the current mirror ratio is then applied to the output transistor $Q_{16}$. Since the absorption current of the transistor $Q_{16}$ flows in the diode $D_{11}$, a current equal to the absorption current is applied to the emitter follower transistor $Q_{11}$ from the output transistor $Q_{15}$ in the current drainage type current mirror circuit.

In order to supply currents in a predetermined ratio to the transistors $Q_{12}$ and $Q_{13}$, a current drainage type current mirror circuit is provided consisting of a transistor $Q_{17}$ and a diode $D_{13}$ and a current absorption type current mirror circuit is provided consisting of a transistor $Q_{18}$, a diode $D_{14}$ and resistors $R_{17}$ and $R_{18}$. The collector current of the transistor $Q_{13}$ is applied to the diode $D_{14}$ in the current absorption type current mirror circuit, and a current defined by the current mirror ratio flows in the output transistor $Q_{18}$. The absorption current of the transistor $Q_{18}$ flows in the diode $D_{13}$, and therefore a current equal to the absorption current flows from the output transistor $Q_{17}$ in the current drainage type current mirror circuit into the emitter follower transistor $Q_{12}$.

It will be appreciated that the differential amplifier circuit illustrated in FIG. 5 operates in a manner quite similar to that in FIG. 3. However, the circuit of FIG. 5 utilizes third and fourth transistors $Q_{13}$ and $Q_{14}$ which are of the same conductivity type as the first and second transistors $Q_{11}$ and $Q_{12}$, whereas the third and fourth transistors in the circuit of FIG. 3 are of the opposite conductivity type from the first and second transistors. Further, whereas the circuitry of FIG. 3 applied the currents in a predetermined ratio to the transistors $Q_1$ and $Q_3$, and to the transistors $Q_2$ and $Q_4$, the embodiment of FIG. 5 couples currents in a predetermined ratio to the transistors $Q_{11}$ and $Q_{14}$ and to the transistors $Q_{12}$ and $Q_{13}$.

When the relationship between the input voltage $e_i$ and the emitter currents $i_{e3}$ and $i_{e4}$ is considered with respect only to the AC components, the following expression is obtained:

$$e_i = v_{be11} + v_{be13} + i_{e13}R_{13} + i_{e14}R_{14} - v_{be14} - v_{be12} \quad (11)$$

which is similar to equation (6) except for the signs of $v_{be11}$ and $v_{be12}$.

Let us consider the case where the input voltage changes in the positive direction under the condition that the resistors $R_{15}$ and $R_{16}$ and the resistors $R_{17}$ and $R_{18}$ in the current mirror circuits are made equal so as to set the current mirror ratios to one (1). In this case, the collector current of the transistor $Q_{13}$ decreases, while the collector current of the transistor $Q_{14}$ increases. Therefore, the variation widths $\Delta V_{BE11}$ and $\Delta V_{BE14}$ of the base-emitter voltages of the transistors $Q_{11}$ and $Q_{14}$ increase, while the variation widths $\Delta V_{BE12}$ and $\Delta V_{BE13}$ of the base-emitter voltages of the transistors $Q_{12}$ and $Q_{13}$ decrease. Accordingly, in the expression (11), the components $v_{be11}$ and $v_{be14}$ are equal and cancel each other, and the components $v_{be12}$ and $v_{be13}$ also cancel each other. As a result, the expression (11) can be rewritten into the following expression (12):

$$e_i = i_{e13} \cdot R_{13} + i_{e14} \cdot R_{14} = v_{ee} \quad (12)$$

Thus, the input voltage $e_i$ is substantially linearly proportional to the emitter-emitter voltage $v_{ee}$. The positive phase output $v_{O2}$ is:

$$v_{O2} = \frac{R_{16}}{R_{13} + R_{14}} v_{ee} \quad (13)$$

Thus, the input and the output are linearly proportional in a relationship which includes no AC components $v_{be}$. The output therefore exhibits substantially no distortion.

In the case also where the input voltage changes in the negative direction, the AC components of the transistors are similarly cancelled out, and a distortionless output is provided in the same manner as with a positive going input voltage.

In the above-described example, the current mirror ratios of the current mirror circuits are set to one (1), but the circuit will operate properly if the current mirror ratios are set to any constant value $\alpha$. Since the relationship between the data $V_{BE}$ and $I_C$ of a transistor can be represented by the expression (1), the difference between the base-emitter voltages of the transistors $Q_{11}$ and $Q_{14}$ is represented by the following expression (14):

$$V_{BE11} - V_{BE14} = \frac{KT}{q}\left\{\ln\left(\frac{I_{C11}}{I_{S11}} + 1\right) - \ln\left(\frac{I_{C14}}{I_{S14}} + 1\right)\right\} \quad (14)$$

For the purposes of this explanation, it will again be assumed that the junction temperatures are equal, and that $I_{C11}/I_{S11} \gg 1$ $I_{C14}/I_{S14} \gg 1$. If $I_{C11}/I_{C14} = \alpha$ (the current mirror ratio), then the expression (14) can be rewritten as follows:

$$V_{BE11} - V_{BE14} \approx \frac{KT}{q}\ln\left(\frac{1}{\alpha}\right) \quad (15)$$

In this case, $I_{S11} = I_{S14}$. Similarly, the relationship indicated by the expression (15) holds for the difference between the base-emitter voltages ($V_{BE}$) of the transistors $Q_{13}$ and $Q_{12}$. These difference voltages will thus have the same constant time value. Accordingly, in the expression (11), ($v_{be11} - v_{be14}$) and ($v_{be13} - v_{be12}$) become constant, and it can be seen that the output will be independent of AC components of $v_{be}$ and will be distortionless as long as the current mirror ratios are set to any constant value $\alpha$.

Figure 6:
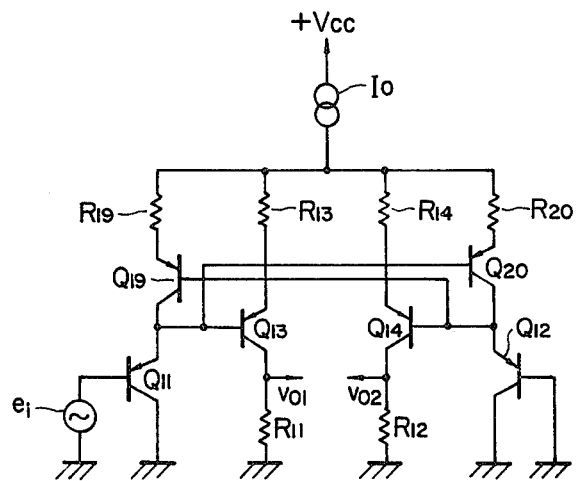
FIG. 6 is a circuit diagram of a second example of a differential amplifier according to a second embodiment of this invention.

FIG. 6 is a circuit diagram showing another example of the second embodiment of a differential amplifier according to this invention. In FIGS. 5 and 6, like parts are designated by like reference characters. In the circuit of FIG. 5, the collector currents of the differential transistors and the emitter follower transistors are combined with the aid of the current mirror circuit, so that the currents flow in the predetermined ratios.

In the circuit of FIG. 6, the base of a transistor $Q_{19}$ is connected to the base of the differential transistor $Q_{14}$, and the output current of the transistor $Q_{19}$ is applied to the emitter follower transistor $Q_{11}$. By suitably setting the ratio of the emitter resistors $R_{14}$ and $R_{19}$, the ratio of emitter currents of the transistors $Q_{14}$ and $Q_{19}$ is made constant, whereby the ratio of emitter currents of the transistors $Q_{14}$ and $Q_{11}$ is also made constant. Similarly, a transistor $Q_{20}$ is provided in such a manner that its base is connected to the base of the transistor $Q_{13}$. The ratio of emitter currents of the transistors $Q_{13}$ and $Q_{12}$ is made constant by suitably setting the ratio of the resistors $R_{13}$ and $R_{20}$.

Similarly as in the first example in FIG. 5, in the second example in FIG. 6 the difference between the components $v_{be}$ of the transistors $Q_{11}$ and $Q_{14}$ and the transistors $Q_{12}$ and $Q_{13}$ become zero or constant, and a distortionless output signal is provided.

Figure 7:
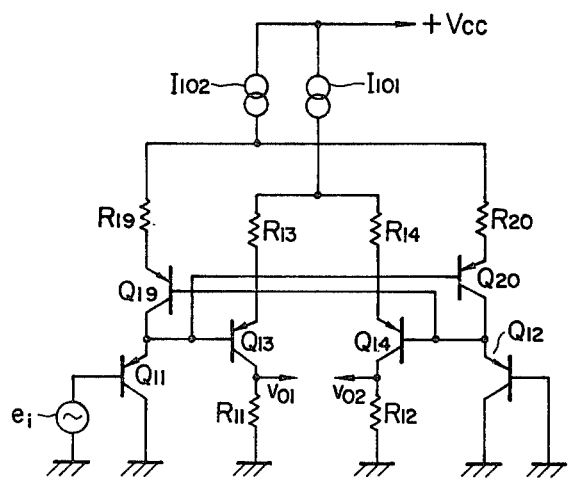
FIG. 7 is a circuit diagram of a third example of a differential amplifier according to a second embodiment of this invention.

FIG. 7 is a circuit diagram showing a third example of the second embodiment of the differential amplifier according to this invention. In FIGS. 7 and 6, like parts are designated by like reference characters. In this third example, current sources $I_{101}$ and $I_{102}$ are provided for the differential transistors $Q_{13}$ and $Q_{14}$ and the differential transistors $Q_{19}$ and $Q_{20}$, respectively, and the other current elements are arranged similarly as in the second example shown in FIG. 6. In this third example also, the output is distortionless.

While the first and second embodiments of this invention differ in the conductivity type of transistors used and in the specific types of current mirror circuits used, it will be seen, e.g. from the similarlity of equations (11)–(15) to the equations (6)–(10), that the circuits all operate in a substantially similar manner and are based upon a common principal. Each circuit utilizes a second set of transistors to cancel the base-emitter voltage terms from the equation defining the relationships of the AC input and output signals.

In the examples described above, the output is provided by the utilization of the voltages developed across the transistors of the current mirror circuits. However, the output may also be provided as follows. If the ratios of currents flowing in the transistors $Q_2$ and $Q_4$ and in the transistors $Q_1$ and $Q_3$ are made constant, and if resistors are inserted in the paths of currents flowing in these transistors, then the output can be provided by the use of voltages developed across these resistors.

Further, in the above-described examples the current mirror circuits are employed as the current supply means. However, it goes without saying that the current mirror circuits may be replaced by circuits which are equivalent in function to the current mirror circuits. Furthermore, the above-described transistors may be replaced by transistors whose electrical conductivities are opposite those of the transistors described above.

As is apparent from the above description, the distortion attributed to the non-linear input-output characteristics of transistors can be substantially eliminated without the use of a feedback technique. Thus, the differential amplifier provided by this invention is stable at all times.

What is claimed is:

1. A differential amplifier, comprising:
   a first transistor having a base and having an output terminal for providing an output signal;
   a second transistor having a base and having an output terminal for providing an output signal;
   means for applying a differential input to the bases of said first and second transistors;
   third and fourth transistors each having a base, said first and second transistor outputs being differentially applied across said third and fourth transistor bases;
   means for supplying currents in a predetermined ratio to said first and third transistors and for supplying currents in a predetermined ratio to said second and fourth transistors; and
   means for providing a differential amplifier output in accordance with variations of current flow through at least one of said third and fourth transistors.

2. A differential amplifier as defined in claim 1, wherein said first ($Q_1$) and second ($Q_2$) transistors are of one conductivity type and said third ($Q_3$) and fourth ($Q_4$) transistors are of a second conductivity type opposite said first conductivity type.

3. A differential amplifier as defined in claim 2, wherein said means for providing currents to said first through fourth transistors comprises a first current mirror circuit having a first current path coupled in series with the emitter-collector path of said first transistor and a second current path coupled in series with the emitter-collector path of said third transistor; and a second current mirror circuit having a third current path connected in series with the emitter-collector path of said second transistor and a fourth current path coupled in series with the emitter-collector path of said fourth transistor.

4. A differential amplifier as defined in claim 3, wherein said means for supplying currents to said first through fourth transistors further comprises a single constant current source coupled through a first resistor ($R_3$) to said third transistor and through a second resistor ($R_4$) to said fourth transistor.

5. A differential amplifier as defined in claim 3, wherein said means for supplying currents to said first through fourth transistors further comprises a first constant current source ($I_{O1}$) for providing a constant current to said third transistor; a second constant current source ($I_{O1}$) for providing a constant current to said fourth transistor; and a resistor ($R_E$) coupled between said third and fourth transistors.

6. A differential amplifier as defined in either claim 1 or 2, wherein each of said first and second transistors is connected in an emitter follower configuration, each having an emitter follower output, and wherein the emitter follower outputs of said first and second transistors are applied to the bases of said third and fourth transistors, respectively.

7. A differential amplifier as defined in claim 1, wherein said first ($Q_{11}$), second ($Q_{12}$), third ($Q_{14}$) and fourth ($Q_{13}$) transistors are of the same conductivity type.

8. A differential amplifier as defined in either claim 1 or 7, wherein each of said first and second transistors is connected in an emitter follower configuration having an emitter follower output, and wherein the emitter follower outputs of said first and second transistors are applied to the bases of said fourth and third transistors, respectively.

9. A differential amplifier as defined in claim 7, wherein said means for supplying currents to said first through fourth transistors comprises a fifth transistor ($Q_{15}$, $Q_{19}$) of said one conductivity type and having its emitter-collector path coupled in series with the emitter-collector path of said first transistor ($Q_{11}$), and a sixth transistor ($Q_{17}$, $Q_{20}$) of said one conductivity type and having its emitter-collector path coupled in series with the emitter-collector path of said second transistor ($Q_{12}$).

10. A differential amplifier as defined in claim 9, wherein the bases of said fifth ($Q_{19}$) and sixth ($Q_{20}$) transistors are coupled to the bases of said third ($Q_{14}$) and fourth ($Q_{13}$) transistors, respectively.

11. A differential amplifier as defined in claim 10, wherein said means for supplying currents to said first through fourth transistors further comprises:
- a source of constant current;
- a respective resistor coupled between said source of constant current and each of said third through sixth transistors;
- output resistors ($R_{11}$, $R_{12}$) coupled to output terminals of each of said third and fourth transistors.

* * * * *